United States Patent
Yokoyama et al.

(10) Patent No.: US 8,354,606 B2
(45) Date of Patent: Jan. 15, 2013

(54) PUSH SWITCH EQUIPPED WITH CAPACITANCE SENSOR AND INPUT DEVICE INCLUDING THE SAME

(75) Inventors: Tatsuya Yokoyama, Miyagi-Ken (JP); Yu Takeda, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 333 days.

(21) Appl. No.: 12/860,628

(22) Filed: Aug. 20, 2010

(65) Prior Publication Data

US 2011/0042196 A1    Feb. 24, 2011

(30) Foreign Application Priority Data

Aug. 21, 2009    (JP) .................. 2009-192428

(51) Int. Cl.
*H03K 17/975*    (2006.01)
(52) U.S. Cl. ....................... 200/600; 345/173
(58) Field of Classification Search .......... 200/600, 200/5 A, 341; 345/173
See application file for complete search history.

(56) References Cited

U.S. PATENT DOCUMENTS

| | | | | |
|---|---|---|---|---|
| 4,458,293 A | * | 7/1984 | Cherry | 341/33 |
| 7,166,813 B2 | * | 1/2007 | Soma et al. | 200/600 |
| 7,515,140 B2 | * | 4/2009 | Philipp | 345/173 |
| 7,741,858 B2 | * | 6/2010 | Jeong | 324/661 |
| 8,168,908 B2 | * | 5/2012 | Heimann | 200/600 |
| 8,173,925 B2 | * | 5/2012 | Wustenbecker | 200/600 |
| 2007/0052598 A1 | | 3/2007 | Lan | |
| 2010/0059349 A1 | | 3/2010 | Wuestenbecker | |

* cited by examiner

*Primary Examiner* — Xuong Chung Trans
(74) *Attorney, Agent, or Firm* — Brinks Hofer Gilson & Lione

(57) ABSTRACT

A push switch includes an operating member, a holding member, a detecting electrode including a plate-shaped spring, a conductive coil spring, and a wiring substrate. The operating member includes a top portion. The rear surface of the top portion and the holding member define a storage space. The detecting electrode, received in the storage space, includes a detecting portion in resilient contact with the top portion, a base in resilient contact with the coil spring, and a height adjusting portion coupling the detecting portion to the base. The amount of compression of the detecting electrode is defined depending on the height of the storage space. The detecting portion detects a change in capacitance caused when the operation surface is touched by a human body and a detection signal indicating the change is output to the wiring substrate through the height adjusting portion, the base, and the coil spring.

6 Claims, 7 Drawing Sheets

PUSH SWITCH EQUIPPED WITH CAPACITANCE SENSOR AND INPUT DEVICE INCLUDING THE SAME

CLAIM OF PRIORITY

This application claims benefit of the Japanese Patent Application No. 2009-192428 filed on Aug. 21, 2009, which is hereby incorporated by reference in its entirety.

BACKGROUND OF THE DISCLOSURE

1. Field of the Disclosure

The present disclosure relates to a push switch equipped with a capacitance sensor having a function capable of detecting a touch on an operation surface by a human body (finger) and an input device including a plurality of the capacitance-sensor-equipped push switches arranged in parallel.

2. Description of the Related Art

Easy-to-operate push switches are often arranged in operating areas of vehicle-mounted controllers of, for example, air conditioners, audio systems, and navigation systems. In an operating area of this type, a plurality of push switches are typically arranged in parallel to each other. A user therefore has to visually confirm the position of a desired push switch and then push the switch. However, while driving, the user has to take his or her eyes off forward roadway and look at hand in order to find a desired push switch and put a finger on the switch. Disadvantageously, the user may tend to neglect to pay attention to the roadway.

There has been proposed a push switch equipped with a capacitance sensor function for detecting, on the basis of a change in capacitance caused when an operation surface is touched by a human body, whether a user's finger is in contact with the operation surface (refer to Japanese Unexamined Patent Application Publication No. 2007-73506, for example). In the related-art push switch equipped with the capacitance sensor, a detecting electrode made of a metal plate is integrated with the rear surface of an operation surface of an operating member. When a user's finger touches the operation surface, a detection signal indicative of a change in capacitance is supplied from the detecting electrode through a wiring substrate to a control unit. The operating member is supported by a support such that the operating member is movable downward and upward in the direction (hereinafter, "pushing direction") in which the operating member is pushed. When the user pushes the operating member, a movable contact moved by the operating member is come into contact with a fixed contact, so that a switch-on signal indicating the electrical connection of the contacts is supplied through the wiring substrate to the control unit. In the related-art push switch, the detecting electrode is moved down or up integrally with the operating member. Accordingly, one end of an electrically conductive coil spring is brought into resilient contact with the wiring substrate with a wiring pattern or the like and the other end of the coil spring is brought into resilient contact with the detecting electrode so that the electrical connection between the detecting electrode and the wiring substrate is kept even when the operating member is moved down and up.

When the capacitance-sensor-equipped push switches schematically constructed as described above are used as operating switches of a vehicle-mounted controller, a display, often installed in a position where a user can see the display while hardly taking user's eyes off forward roadway, can be allowed to display information so that the user can immediately know which push switch is being touched by a user's finger. Consequently, the user can correctly select a desired push switch to perform a pushing operation without looking at hand. Advantageously, the user can easily operate the vehicle-mounted controller without neglecting to pay attention to forward roadway, thus remarkably increasing safety and operability.

In some cases, it is difficult to design an input device including a plurality of push switches parallel-arranged in an operating area so that operation surfaces of the switches are arranged at the same height (or level) relative to a wiring substrate. For example, since there are many design and space restrictions on an operating area of a vehicle-mounted controller, the operation surfaces of the parallel-arranged push switches have to be placed at different heights relative to the wiring substrate in many cases. In such a case, assuming that the parallel-arranged push switches each have a capacitance sensor function, if the shapes of operating members of the push switches are made different from each other, it is difficult to arrange the operation surfaces of the push switches at different heights relative to the wiring substrate. Previously, therefore, the length in the extending and retracting direction (pushing direction) of a coil spring interposed between a detecting electrode and the wiring substrate varies from switch to switch.

FIG. 9 illustrates a case where two push switches 20 are arranged in parallel on a wiring substrate 30, an operating member 21 of each push switch 20 is mounted on urging member 25 and is supported by a support 26 so that the push switch 20 is movable down and up in FIG. 9 and the levels of operation surfaces 21a of the push switches 20 are made different from each other. In this case, coil springs 22 of the left push switch 20 whose operation surface 21a is at a lower level are incorporated in the switch such that the coil springs 22 are more compressed than the other coil springs 22 of the right push switch 20. The rear surface of the operation surface 21a of the operating member 21 of each push switch 20 is fixed to a detecting electrode 23. The distance between the detecting electrode 23 and the wiring substrate 30 in the left push switch 20 is shorter than that in the right push switch 20, because the coil springs 22 of the push switch 20 differ in length in the extending/retracting direction from those of the other push switch 20 in a non-operation mode. The detecting electrodes 23 are kept to be electrically connected to the wiring substrate 30 at any time, thus ensuring the capacitance sensor functions. In FIG. 9, a holding member 24 is fixed to each operating member 21 such that the holding member 24 is placed inside the operating member 21. Since the coil springs 22 are inserted through through-holes 24a of each holding member 24, the extending/retracting direction of the coil springs 22 can be made identical to the pushing direction, thus ensuring the reliability of electrical connection.

In the case where the coil springs 22 having the same length and spring constant are incorporated in the push switches such that the coil springs have different compressed states in order to make the levels of the operation surfaces 21a of the parallel-arranged push switches 20 different from each other, however, a reaction force caused by the coil springs 22 when the user pushes the operation surface 21a of the push switch 20 differs from push switch 20 to push switch 20. Disadvantageously, a pushing force varies from push switch 20 to push switch 20. To prevent a variation in pushing force, various coil springs 22 having different lengths and spring constants may be prepared. However, it is not preferable because the cost of parts of the push switches 20 is remarkably increased. If the push switches 20 are set so as to have a uniform distance between the detecting electrode 23 and the wiring substrate 30 irrespective of the level of the operation surface 21a, it is unnecessary to prepare various coil springs 22. However, it is undesirable because the distance between the operation surface 21a and the detecting electrode 23 differs from push switch 20 to push switch 20 and this results in a large variation in the accuracy of capacitance detection.

SUMMARY

A push switch equipped with a capacitance sensor is disclosed. The switch includes an operating member having a top portion whose front surface serves as an operation surface. A detecting electrode is in contact with the rear surface of the top portion. A holding member is fixed to the operating member and has a through-hole that faces the detecting electrode. A conductive coil spring is inserted through the through-hole, one end of the coil spring being in resilient contact with the detecting electrode. A support supports the operating member so that the member is movable forward and backward. An urging member elastically urges the operating member in a backward moving direction. A wiring substrate is provided with an electrode portion in resilient contact with the other end of the coil spring. A contact portion generates a switch-on signal when driven by the operating member which is pushed. The detecting electrode generates a detection signal on the basis of a change in capacitance caused when the operation surface is touched by a human body. The operating member has a storage space between the rear surface of the top portion and the holding member. The detecting electrode in the form of a plate-shaped spring more resistant to resilient deformation than the coil spring is received in the storage space. The detecting electrode includes a detecting portion in resilient contact with the rear surface of the top portion, a base in resilient contact with the one end of the coil spring, and a height adjusting portion coupling the detecting portion to the base. The amount of compression of the detecting electrode is defined depending on the height of the storage space.

In the push switch with the above-described structure, since the detecting electrode in the form of the plate-shaped spring is received in the storage space of the operating member, the detecting portion of the detecting electrode detects a change in capacitance caused when the operation surface is touched by a human body (finger) and a detection signal indicating the change is output from the detecting portion to the wiring substrate through the height adjusting portion and the base of the detecting electrode and the coil spring, so that the push switch can be allowed to operate as a capacitance sensor. In addition, this push switch can accommodate a specification, in which the levels of the operation surfaces differ, by appropriately selecting the size of the storage space formed in the operating member so that the distance between the base of the detecting electrode and the wiring substrate is kept constant. Specifically, when the detecting electrode of the push switch is received into the storage space, the detecting electrode is compressed depending on the height of the storage space. Accordingly, even if the size of the storage space varies, the detecting portion and the base of the detecting electrode can be firmly brought into resilient contact with the top portion of the operating member and one end of the coil spring, respectively. This prevents a variation in the accuracy of detection. Accordingly, a plurality of the push switches including the coil springs having the same length and spring constant can accommodate various specifications in which the levels of the operation surfaces differ. Advantageously, a variation in pushing force can be prevented and the detecting electrodes and the holding members can be common to the push switches. Thus, the capacitance-sensor-equipped push switch can accommodate a variety of heights at low cost and exhibit stable operability.

According to another aspect, there is provided an input device having a plurality of push switches having different heights are arranged in parallel, each height being defined between a wiring substrate and an operation surface. A control unit is supplied with a detection signal and a switch-on signal from each push switch. The push switches each include the following elements. An operating member includes a top portion whose front surface serves as the operation surface. A detecting electrode is in contact with the rear surface of the top portion. A holding member is fixed to the operating member and has a through-hole that faces the detecting electrode. A conductive coil spring is inserted through the through-hole, one end of the coil spring being in resilient contact with the detecting electrode. A support supports the operating member so that the member is movable forward and backward. An urging member elastically urges the operating member in a backward moving direction. The wiring substrate is provided with an electrode portion in resilient contact with the other end of the coil spring. A contact portion generates a switch-on signal when driven by the operating member which is pushed. The detecting electrode is capable of generating the detection signal on the basis of a change in capacitance caused when the operation surface is touched by a human body. Each of the push switches is constructed as follows. The operating member has a storage space between the rear surface of the top portion and the holding member, the detecting electrode in the form of a plate-shaped spring more resistant to resilient deformation than the coil spring is received in the storage space, the detecting electrode includes a detecting portion in resilient contact with the rear surface of the top portion, a base in resilient contact with the one end of the coil spring, and a height adjusting portion coupling the detecting portion to the base. The amount of compression of the detecting electrode is defined depending on the height of the storage space. The push switches have the same distance between the base and the wiring substrate.

In each of the push switches of the input device with the above-described structure, since the detecting electrode in the form of the plate-shaped spring is received in the storage space of the operating member, the detecting portion of the detecting electrode detects a change in capacitance caused when the operation surface is touched by a human body (finger) and a detection signal indicating the change is output from the detecting portion to the wiring substrate through the height adjusting portion and the base of the detecting electrode and the coil spring, so that the push switch can be allowed to operate as a capacitance sensor. In addition, the push switches are set so as to have the same distance between the base of the detecting electrode and the wiring substrate by appropriately selecting the size of the storage space formed in each operating member. Specifically, when the detecting electrode of each push switch is received into the corresponding storage space, the detecting electrode is compressed depending on the height of the storage space. Accordingly, even if the size of the storage space varies, the detecting portion and the base of the detecting electrode can be firmly brought into resilient contact with the top portion of the operating member and one end of the coil spring, respectively. This prevents a variation in the accuracy of detection. Accordingly, coil springs having the same length and spring constant can be used in a plurality of push switches with operation surfaces different in level. In addition, the detecting electrodes and the holding members can be common to the push switches. In spite of the fact that the operation surfaces of the capacitance-sensor-equipped push switches placed in parallel are arranged at different levels relative to the wiring substrate, therefore, the input device allows the push switches to be operated by the same pushing force, thus increasing operability. In addition, since commonality of parts between the push switches can be easily achieved, the manufacturing cost of the input device can be reduced.

DESCRIPTION OF THE EXEMPLARY EMBODIMENTS

Figure 1:
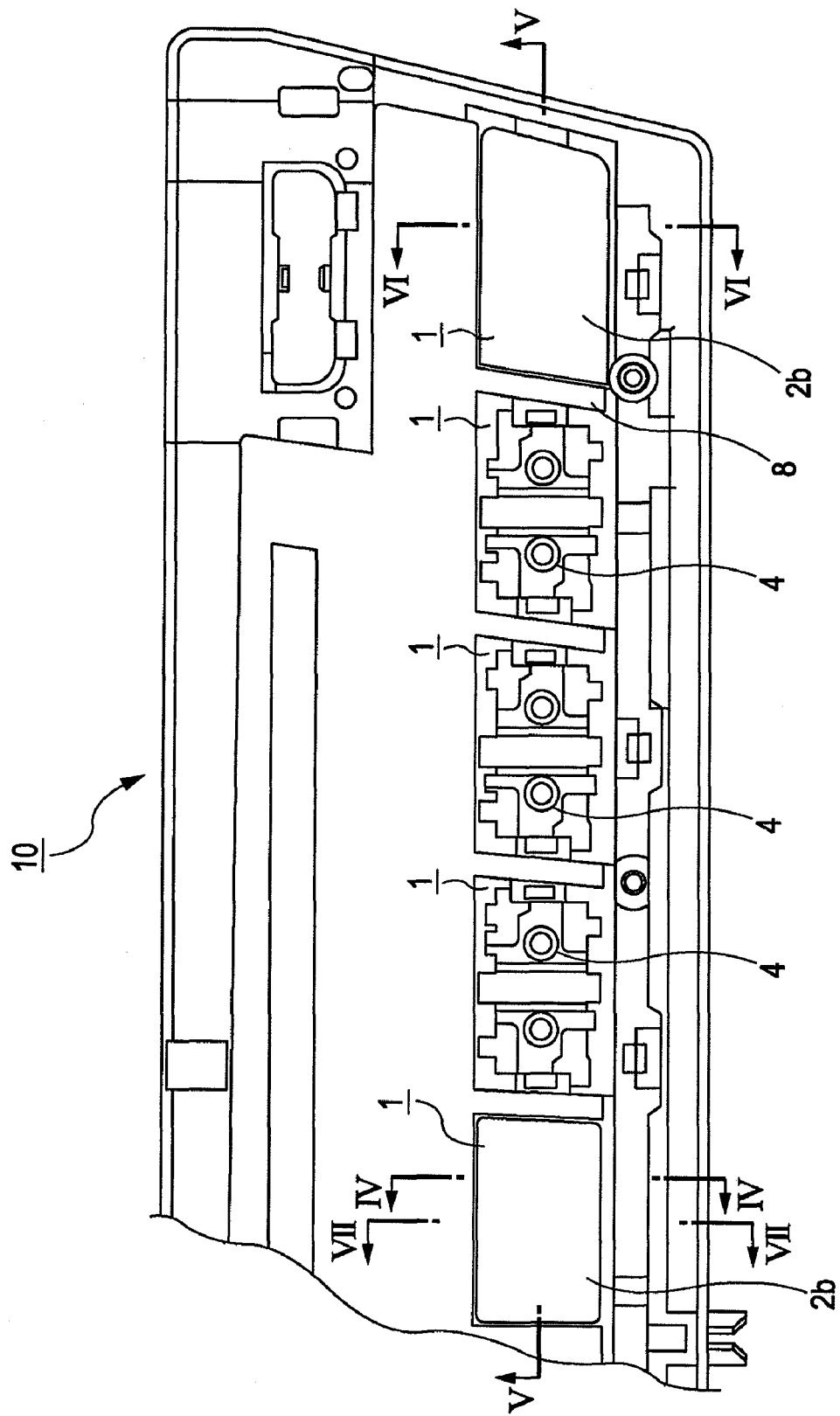
FIG. 1 is a plan view of an input device including a plurality of paralleled capacitance-sensor-equipped push switches according to an embodiment of the present invention with a part of the device cut away.
Figure 7:
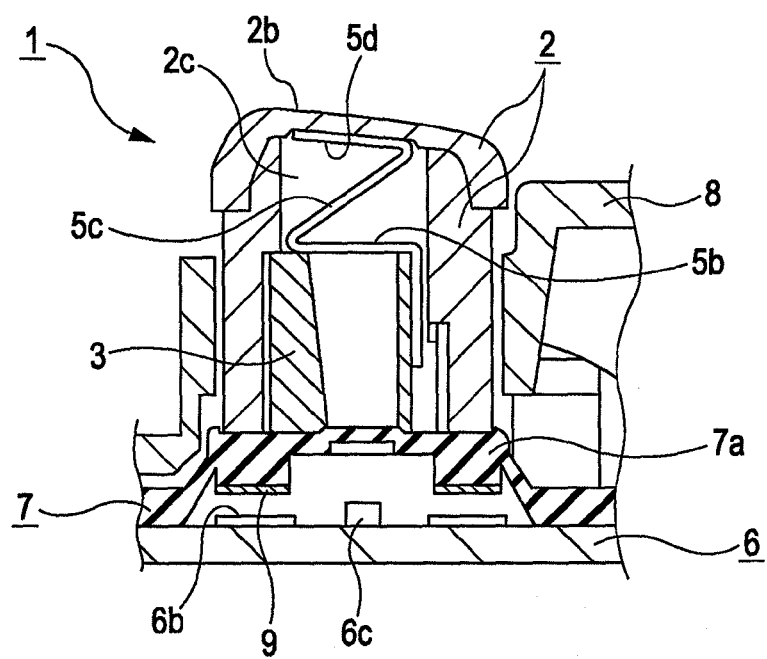
FIG. 7 is a cross-sectional view taken along the line VII-VII in FIG. 1.
Figure 8:
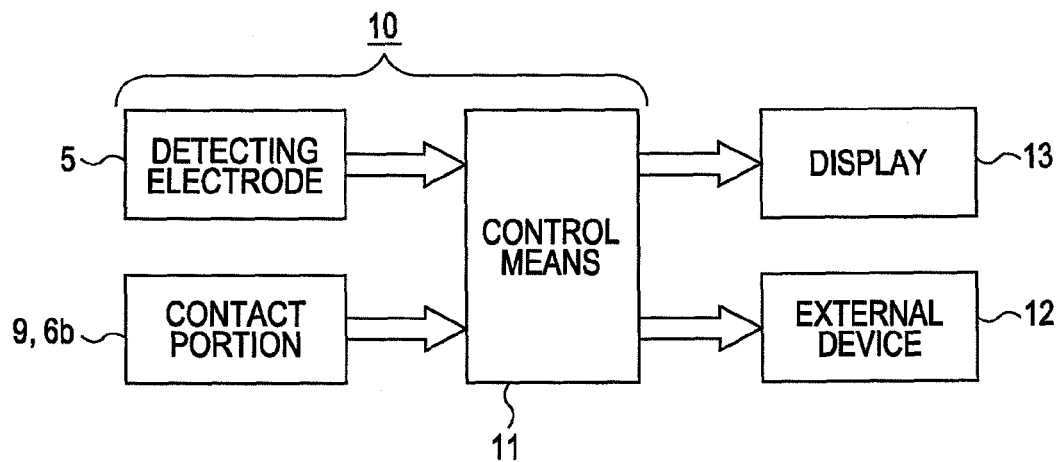
FIG. 8 is a block diagram of a control system of the input device according to the embodiment.
Figure 9:
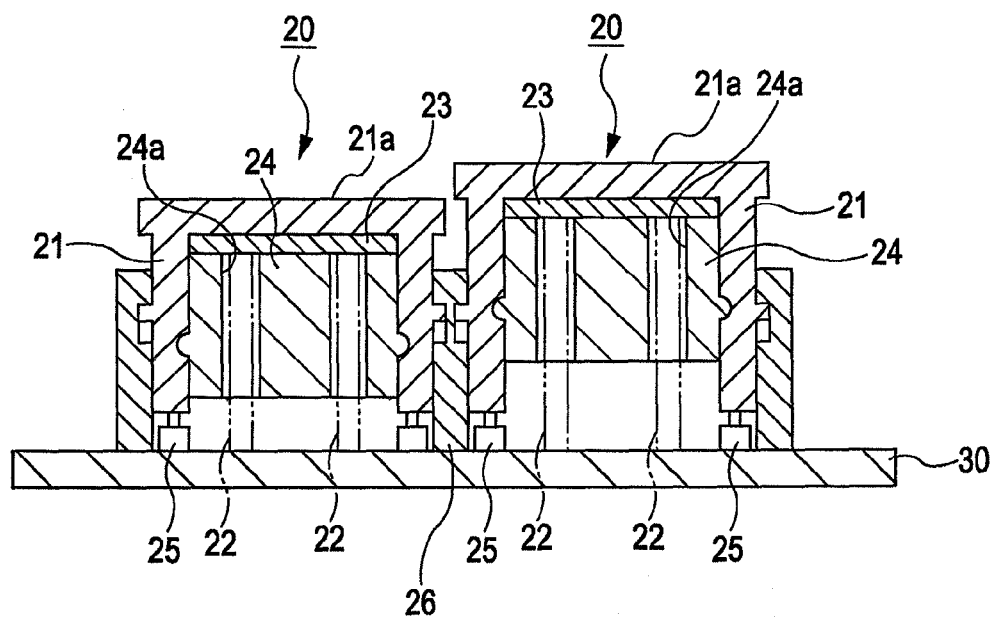
FIG. 9 is a cross-sectional view of related-art capacitance-sensor-equipped push switches.

An embodiment of the present invention will be described with reference to FIGS. 1 to 8. Push switches 1 illustrated in the figures each have a capacitance sensor function capable of detecting a touch on an operation surface 2b by a human body (finger). As illustrated in FIGS. 1 and 5, the push switches 1 sharing a wiring substrate 6 are aligned in parallel in an operating area of an input device 10 according to this embodiment. Although the push switches 1 fundamentally have the same structure, the levels of the operation surfaces 2b of the push switches 1 are made different slightly from each other due to design and space restrictions. Referring to FIG. 8, a signal generated by each push switch 1 is transmitted to and processed by control unit 11 of the input device 10. After that, the control unit 11 outputs a predetermined control signal to an external device 12 to be controlled or a display 13 that displays information indicating, for example, descriptions of control.

The structure of each push switch 1 will now be described. The capacitance-sensor-equipped push switch 1 mainly includes an operating member 2, a holding member 3 having a pair of through-holes 3a, a pair of conductive coil springs 4 inserted through the through-holes 3a, respectively, a detecting electrode 5, the wiring substrate 6, a rubber sheet 7, and a support 8 integrated with the wiring substrate 6. The operating member 2 includes a top portion 2a whose front surface serves as the operation surface 2b. The holding member 3 is fixed to the operating member 2. The detecting electrode 5 is secured in engagement with the holding member 3 and is in resilient contact with the rear surface of the top portion 2a. The wiring substrate 6 is provided with electrode portions 6b, fixed contacts 6b, and an LED 6c. The rubber sheet 7 having bulges 7a is mounted on the wiring substrate 6. The support 8 supports the operating member 2 so that the member is reciprocatable, or movable forward (down) and backward (up).

The operating member 2 of each push switch 1 is mounted on the corresponding bulge 7a of the rubber sheet 7. The wiring substrate 6, the rubber sheet 7, and the support 8 extend so as to be shared by the push switches 1.

The operating member 2 is constructed as follows. When a user pushes (performs a pushing operation on) the operation surface 2b with a finger, the operating member 2 is shifted to the wiring substrate 6, thus thrusting and deflecting the bulge 7a and compressing the coil springs 4. When such an operating force is released, the operating member 2 is returned to the original level by a reaction force caused by the bulge 7a and the coil springs 4. The operating member 2 has a storage space 2c between the rear surface of the top portion 2a and the holding member 3. Plate-shaped spring portions of the detecting electrode 5 are received in the storage space 2c. Two engaging protrusions 2d outwardly protrude from two external side walls of the operating member 2, respectively. In the non-operation mode, each engaging protrusion 2d is supported in contact with a stopper portion 8a of the support 8 so that the engaging protrusion 2d is engaged with the stopper portion 8a. The operating member 2 further includes a pair of thrusting portions 2e for thrusting and deflecting the bulge 7a of the rubber sheet 7 upon pushing operation.

Figure 2:
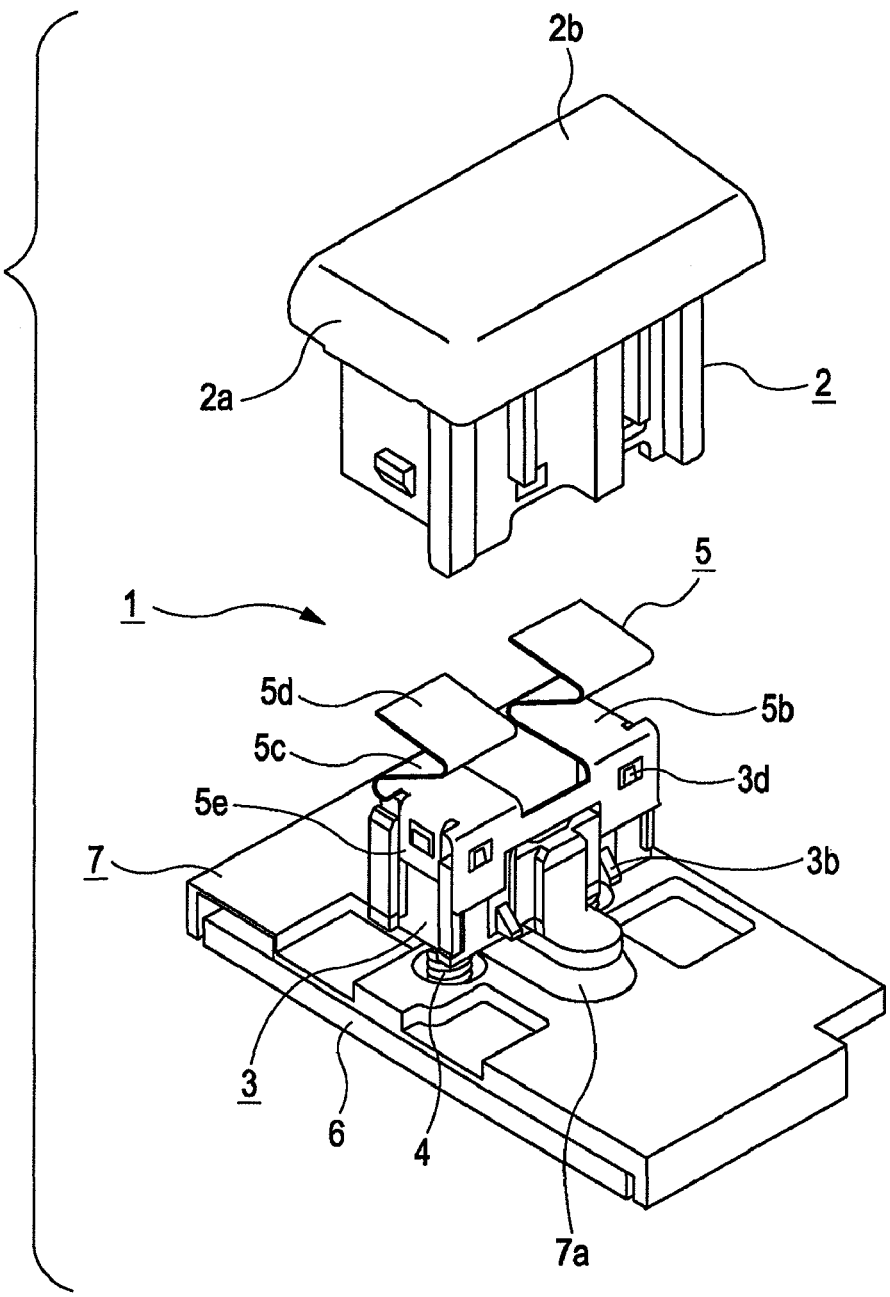
FIG. 2 is a perspective view of one push switch in FIG. 1, an operating member being detached from the push switch.
Figure 3:
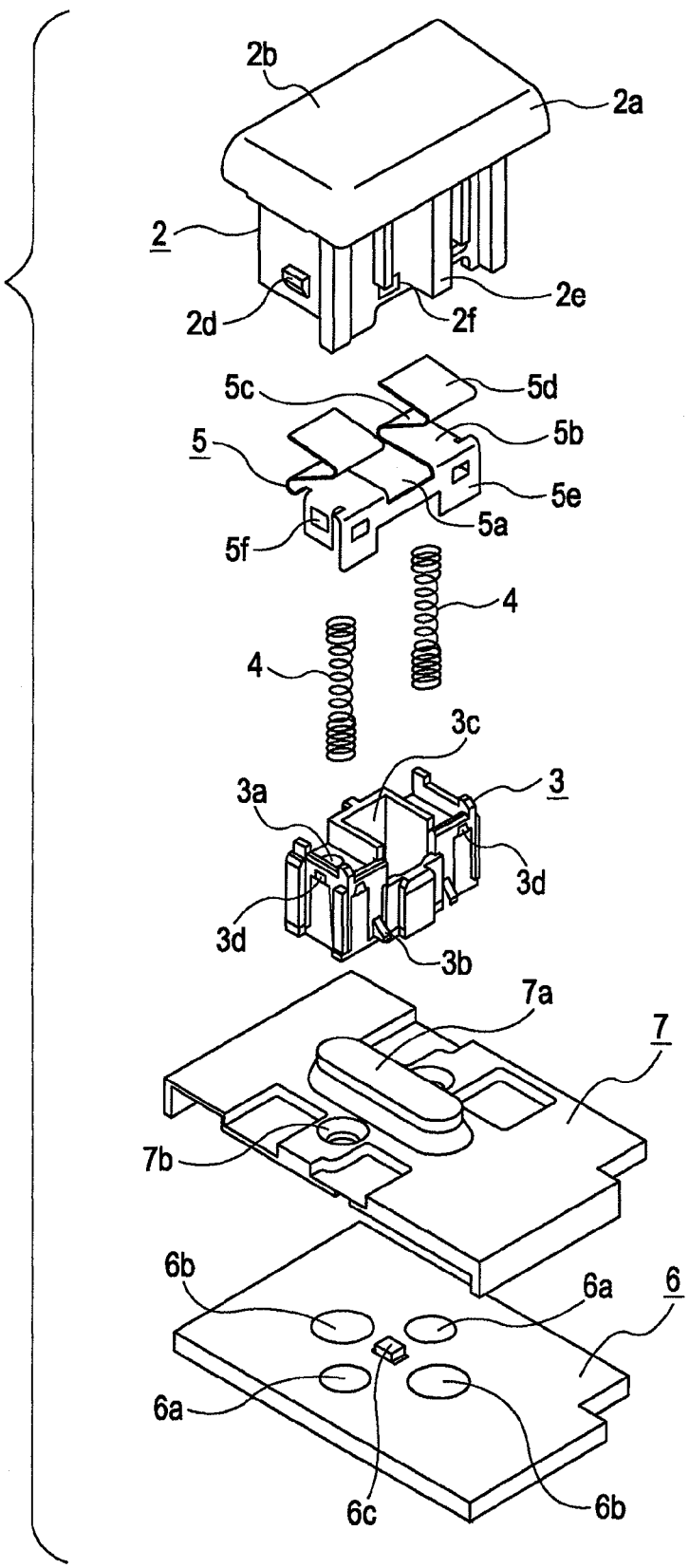
FIG. 3 is an exploded perspective view of the push switch of FIG. 2.
Figure 4:
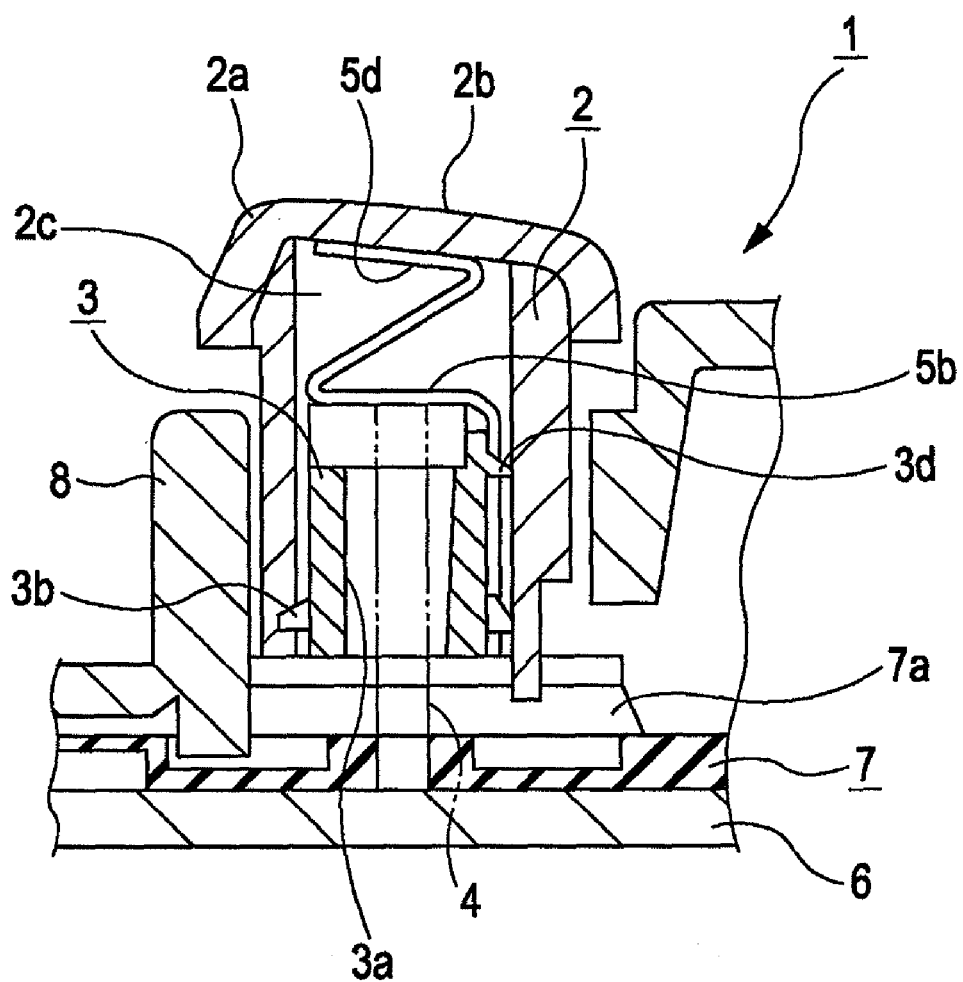
FIG. 4 is a cross-sectional view taken along the line IV-IV in FIG. 1.
Figure 5:
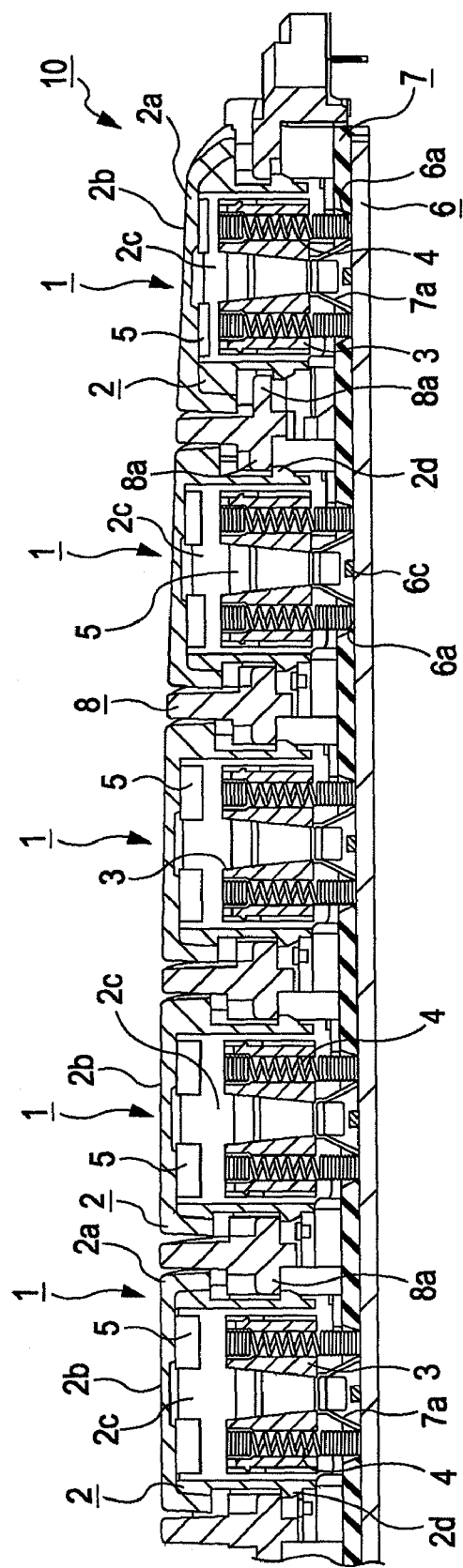
FIG. 5 is a longitudinal sectional view taken along the line V-V in FIG. 1.
Figure 6:
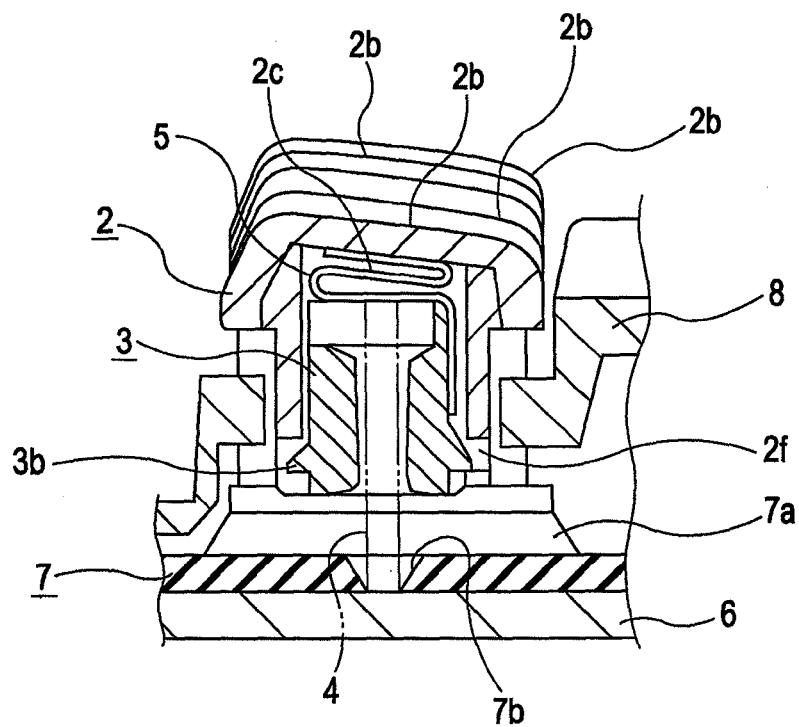
FIG. 6 is a cross-sectional side elevation view taken along the line VI-VI in FIG. 1.

Referring to FIGS. 2 to 4 and 6, a plurality of anchoring protrusions 3b outwardly protrude from lower parts of external side walls of the holding member 3. These anchoring protrusions 3b are snapped into engagement with engagement holes 2f of the operating member 2, respectively, so that the holding member 3 is fixed at a predetermined position in the operating member 2. The holding member 3 is attached to the operating member 2 in this manner, thus defining the storage space 2c between the holding member 3 and the top portion 2a and positioning the through-holes 3a in the storage space 2c. Referring to FIGS. 4 to 6, the coil springs 4 inserted through the through-holes 3a of the holding member 3 are mounted on the electrode portions 6a of the wiring substrate 6, respectively. The ends of each coil spring 4 are in resilient contact with the detecting electrode 5 and the electrode portion 6a, respectively. The holding member 3 has an opening 3c at the center thereof.

Referring to FIG. 5, although the holding members 3 of the push switches 1 are arranged at the same height (level) from the wiring substrate 6, the storage spaces 2c of the push switches 1 differ in height from each other. Specifically, the push switches 1 are designed such that higher the level of the operation surface 2b of the push switch 1, higher the height of the storage space 2c thereof.

The detecting electrode 5 is made by forming a conductive metal plate into a shape illustrated in FIGS. 2 and 3. Referring to FIGS. 2 and 3, the detecting electrode 5 includes a flat base 5b having an opening 5a, a pair of height adjusting portions 5c obliquely upwardly extending from folded parts in one end of the base 5b, a pair of detecting portions 5d obliquely upwardly extending from folded parts in the upper ends of the height adjusting portions 5c, and a plurality of attachment portions 5e downwardly extending from the other ends of the base 5b. The height adjusting portions 5c and the detecting portions 5d serve as plate-shaped spring portions which are compressible so as to be folded. The attachment portions 5e each have an engagement hole 5f. Protrusions 3d outwardly protruding from upper parts of side walls of the holding member 3 are snapped into engagement with the engagement holes 5f, respectively, so that the attachment portions 5e of the detecting electrode 5 are secured into engagement with the holding member 3. The holding member 3 is attached at a predetermined position in the operating member 2, so that the plate-shaped spring portions of the detecting electrode 5 are compressed by an appropriate amount depending on the height of the storage space 2c and the detecting portions 5d are brought into resilient contact with the rear surface of the top portion 2a, as illustrated in FIGS. 4 and 6. After the holding member 3 and the detecting electrode 5 are incorporated into the operating member 2 in the above-described manner, the operating member 2 is mounted on the bulge 7a of the rubber sheet 7 while the coil springs 4 are inserted through the through-holes 3a of the holding member 3 and is reciprocatably supported by the support 8. Thus, the ends of each coil spring 4 are in resilient contact with the base 5b of the detecting electrode 5 and the electrode portion 6a, respectively. Since the plate-shaped spring portions of the detecting electrode 5 are extremely more resistant to resilient deformation than the coil springs 4, the detecting electrode 5 is hardly thrust and deflected even when the coil springs 4 are compressed upon pushing operation.

Each bulge 7a of the rubber sheet 7 extends between the two coil springs 4. Referring to FIG. 7, movable contacts 9 are arranged in both the inner ends of the bulge 7a in the lengthwise direction thereof, respectively. These movable contacts 9 are positioned above the pair of fixed contacts 6b provided for the wiring substrate 6, respectively. When the thrusting portions 2e of the operating member 2 thrust and deflect the bulge 7a upon pushing operation, the movable contacts 9 are brought into contact with the fixed contacts 6b directly below the movable contacts 9. Referring to FIGS. 2 and 3, in the rubber sheet 7, a pair of circular holes 7b are provided for each push switch such that the lower ends of the coil springs 4 are inserted through the circular holes, respectively. When the rubber sheet 7 is placed on the wiring substrate 6, the pair of electrode portions 6a appear in the circular holes 7b, respectively. Consequently, the lower ends of the coil springs 4 are positioned by the rubber sheet 7 without being displaced from the electrode portions 6a. The bulge 7a covers the LED 6c so that light emitted from the LED 6c passes through thin part (refer to FIG. 7) of the top of the bulge 7a and further passes through the opening 3c of the holding member 3 and the opening 5a of the detecting electrode 5 to illuminate a character or a symbol on the top portion 2a.

An operation of the push switch 1 with the above-described structure will now be described. It is assumed that the user selects any push switch 1 from among the push switches 1 illustrated in FIGS. 1 and 5 and operates the selected switch.

When a user's finger touches the operation surface 2b of one push switch 1, the detecting portions 5d of the detecting electrode 5 of the push switch 1 detects a change in capacitance and a detection signal indicating the change is output from the detecting portions 5d to the control unit 11 via a signal path including the height adjusting portions 5c, the base 5b, the coil springs 4, and the electrode portions 6a. The control unit 11 outputs a control signal based on the detection signal to the display 13. Consequently, for example, the kind of the push switch 1 touched by the user's finger and descriptions of an executable operation are displayed on the display 13.

When the user pushes the operation surface 2b of the one push switch 1, the thrusting portions 2e of the operating member 2 of the push switch 1 thrust, deflect, and buckle the bulge 7a of the rubber sheet 7. Consequently, the movable contacts 9 are brought into contact with the fixed contacts 6b, so that a switch-on signal indicating the electrical connection between the contacts 9 and 6b is output to the control unit 11. The control unit 11 outputs a control signal based on the switch-on signal to the external device 12 as a control target, so that the external device 12 is controlled in accordance with the control signal.

So long as the capacitance-sensor-equipped push switches 1 are arranged in parallel in the operating area and the display 13 can display which push switch 1 is touched by a user's finger, when the push switches 1 are used as operating switches of a vehicle-mounted controller, the user can correctly select a desired push switch 1 and push the switch without looking at hand. Accordingly, the user can easily operate the vehicle-mounted controller without neglecting to pay attention to forward roadway, thus remarkably increasing safety and operability.

Although the input device 10 according to the present embodiment is designed such that the levels of the operation surfaces 2b of the push switches 1 arranged in parallel differ from each other due to design and space restrictions, the heights of the storage spaces 2c in the operating members 2 are appropriately selected so that the holding members 3 of the push switches 1 are placed at a predetermined height relative to the wiring substrate 6. Specifically, although the push switches 1 with the operation surfaces 2b at different levels have different size storage spaces 2c, these switches have the same distance between the base 5b of the detecting electrode 5 and the wiring substrate 6. In addition, when received into the storage space 2c, the detecting electrode 5 of each push switch 1 is compressed depending on the height of the storage space 2c. Even when the storage spaces 2c differ in size from each other, therefore, the detecting portions 5d and the base 5b of each detecting electrode 5 can be firmly brought into resilient contact with the rear surface of the top portion 2a and the ends of the coil springs 4, respectively. There is no fear that the accuracy of detection varies from push switch 1 to push switch 1. In the input device 10, therefore, the coil springs 4 having the same length and spring constant can be included in the push switches 1 with the operation surfaces 2b different in level. Furthermore, the detecting electrodes 5 and the holding members 3 can be common to the push switches 1. Accordingly, the push switches 1 can be operated by the same pushing force, thus increasing operability. In addition, since commonality of parts can be easily achieved, the push switches 1 can be manufactured at low cost.

In addition, although the operation surfaces 2b of the push switches 1 according to the present embodiment differ in level from each other, the push switches 1 can include the coil springs 4 having the same length and spring constant and the detecting electrodes 5 and the holding members 3 can be common to the push switches 1. Advantageously, a variation in pushing force can be prevented and the manufacturing cost can be easily reduced. Therefore, this push switch 1 can accommodate a variety of heights at low cost and exhibit stable operability.

In the present embodiment, each bulge 7a of the rubber sheet 7 mounted on the wiring substrate 6 elastically urges the corresponding operating member 2 in the backward moving direction (opposite to the pushing direction) and the movable contacts 9 provided on the inside of the bulge 7a face the fixed contacts 6b on the wiring substrate 6 so as to be brought into contact with or moved away from the fixed contacts 6b. Accordingly, urging member (bulge 7a) for applying a reaction force to the operating member 2 while cooperating with the coil springs 4 can be easily incorporated into the push switch 1. In addition, the bulges 7a of the push switches 1 can be provided for the single rubber sheet 7. In each push switch 1, contact portions (the fixed contacts 6b and the movable contacts 9) are integrated with the wiring substrate 6 and the bulge 7a. Advantageously, the number of parts can be remarkably reduced, thus providing ease of assembly.

In the present embodiment, each detecting electrode 5 includes the attachment portions 5e secured into engagement with the holding member 3 and the height adjusting portions 5c obliquely extend from the base 5b to the detecting portions 5d within the storage space 2c. Accordingly, when the holding member 3 secured into engagement with the attachment portions 5e of the detecting electrode 5 is attached at the predetermined position in the operating member 2, the plate-shaped spring portions of the detecting electrode 5 are compressed by an appropriate amount depending on the height of the storage space 2c, so that the detecting portions 5d can be firmly brought into resilient contact with the rear surface of the top portion 2a. Thus, the ease of assembly and reliability of each push switch 1 can be easily increased.

What is claimed is:

1. A push switch equipped with a capacitance sensor, the switch comprising:
    an operating member including a top portion whose front surface serves as an operation surface;
    a detecting electrode in contact with the rear surface of the top portion;
    a holding member fixed to the operating member, the holding member having a through-hole that faces the detecting electrode;
    a conductive coil spring inserted through the through-hole, one end of the coil spring being in resilient contact with the detecting electrode;
    a support supporting the operating member so that the member is movable forward and backward;
    an urging member elastically urging the operating member in a backward moving direction;
    a wiring substrate provided with an electrode portion in resilient contact with the other end of the coil spring; and
    a contact portion generating a switch-on signal when driven by the operating member which is pushed,
    the detecting electrode generating a detection signal on the basis of a change in capacitance caused when the operation surface is touched by a human body, wherein
    the operating member having a storage space between the rear surface of the top portion and the holding member,
    the detecting electrode in the form of a plate-shaped spring more resistant to resilient deformation than the coil spring being received in the storage space,
    the detecting electrode including a detecting portion in resilient contact with the rear surface of the top portion, a base in resilient contact with the one end of the coil spring, and a height adjusting portion coupling the detecting portion to the base, and
    the amount of compression of the detecting electrode being defined depending on the height of the storage space.

2. The switch according to claim 1, further comprising:
    a rubber sheet, which is mounted on the wiring substrate and includes a bulge, wherein
    the bulge serves as the urging member,
    a movable contact provided for the inside of the bulge faces a fixed contact provided for the wiring substrate so as to be movable into contact with and away from the fixed contact, and
    the combination of the movable contact and the fixed contact serves as the contact portion.

3. The switch according to claim 1, wherein
    the detecting electrode includes an attachment portion secured into engagement with the holding member, and
    the height adjusting portion obliquely extends between the detecting portion and the base within the storage space.

4. An input device comprising:
    a plurality of push switches having different heights arranged in parallel, each height being defined between a wiring substrate and an operation surface; and
    a control unit supplied with a detection signal and a switch-on signal from each push switch,
    the push switches each including
        an operating member including a top portion whose front surface serves as the operation surface,
        a detecting electrode in contact with the rear surface of the top portion,
        a holding member fixed to the operating member, the holding member having a through-hole that faces the detecting electrode,
        a conductive coil spring inserted through the through-hole, one end of the coil spring being in resilient contact with the detecting electrode,
        a support supporting the operating member so that the member is movable forward and backward,
        an urging member elastically urging the operating member in a backward moving direction,
        the wiring substrate provided with an electrode portion in resilient contact with the other end of the coil spring, and
        a contact portion generating a switch-on signal when driven by the operating member which is pushed,
    the detecting electrode being capable of generating the detection signal on the basis of a change in capacitance caused when the operation surface is touched by a human body, wherein
    each of the push switches is constructed such that
    the operating member has a storage space between the rear surface of the top portion and the holding member,
    the detecting electrode in the form of a plate-shaped spring more resistant to resilient deformation than the coil spring is received in the storage space,
    the detecting electrode includes a detecting portion in resilient contact with the rear surface of the top portion, a base in resilient contact with the one end of the coil spring, and a height adjusting portion coupling the detecting portion to the base, and
    the amount of compression of the detecting electrode is defined depending on the height of the storage space, and
    the push switches have the same distance between the base and the wiring substrate.

5. The input device according to claim 4, wherein
    each of the push switches further includes a rubber sheet which is mounted on the wiring substrate and includes a bulge,
    the bulge serves as the urging member,
    a movable contact provided for the inside of the bulge faces a fixed contact provided for the wiring substrate so as to be movable into contact with and away from the fixed contact, and
    the combination of the movable contact and the fixed contact serves as the contact portion.

6. The input device according to claim 4, wherein
    the detecting electrode of each push switch includes an attachment portion secured into engagement with the holding member, and
    the height adjusting portion obliquely extends between the detecting portion and the base within the storage space.

* * * * *